May 13, 1969 V. P. ROMEO 3,443,298

MEANS FOR INSERTING AND DEFLECTING COMPONENTS

Filed Sept. 12, 1966

Inventor
Vincent P. Romeo
By his Attorney
[signature]

United States Patent Office 3,443,298
Patented May 13, 1969

3,443,298

MEANS FOR INSERTING AND DEFLECTING COMPONENTS

Vincent P. Romeo, Danvers, Mass., assignor to USM Corporation, Flemington, N.J., a corporation of New Jersey Filed Sept. 12, 1966, Ser. No. 578,839
Int. Cl. H05k *3/30;* B27f *7/00*
U.S. Cl. 29—203 3 Claims

ABSTRACT OF THE DISCLOSURE

A component inserting machine having an inserting head for assembling components on a prepunched board and an elongated driver bar having means upon its lower or driving end for laterally displacing the component body out of the plane defined by the line of centers of the holes in the board and the axis of the component body after insertion of the leads but before displacement of the body.

This invention relates generally to component inserting machines which automatically and rapidly place small elements such as electrical components into pre-provided holes in circuit boards. The invention particularly relates to means for and a method of staggering the component bodies so they do not lie in a single plane passing through the line of centers of the recipient holes.

As the need and demand for high quality small electric accessories continues to increase, the electrical manufacturers have been faced with the problem of simultaneously reducing the size of electrical apparatus while retaining quality of performance. The industry has partially solved the problem by making and using smaller components, i.e. transistors, etc. but the same apparatus could be made even smaller if the individual components could be placed in closer juxtaposition. One of the reasons that the components have not to this time been placed closer together was the danger of short circuits between the leads of adjacent components.

The use of automatic inserting machines such as disclosed in U.S. Patent No. 2,896,213, granted to Alderman et al., enables an assembler of circuit boards containing many components to place the components rapidly in the pre-bored holes within the circuit board. The inserting head of the machine receives the components from a conveyor supply, urges the leads into parallelism, the leads lying in approximately the same plane and spaced apart an amount equal to the spacing of the receiving holes, and then places the leads into the holes in the board. The machine assembles the components in a line of holes in the circuit board, placing each component lead into a pair of holes leaving the component body spaced from but directly above the line of centers of the receiving holes. Because of the placement of the component bodies it has been necessary when using presently available component inserting equipment to provide a separate pair of receiving holes for each component and these holes have necessarily been distally spaced from each other to prevent the body of one component from interfering with that of the adjacent component. This requirement for distally spaced holes has greatly increased the size of the component board necessary to receive a given number of components. For example, if several components were to be placed along a given line the board must necessarily have a dimension greater than the sum of the lengths of the components.

Presently available component inserting equipment is not designed to enable the placement of the leads of more than one component easily into a given hole. Thus, because of the aforementioned placement of the components, i.e. the leads of each component in separate holes spaced from one another, it was not practical to use the leads of the components as the sole means for electrically interconnecting same. Consequently a separate conductor means was necessary to join the component leads inserted through separate holes.

It has been found that displacing the component body away from the plane, usually perpendicular to the receiving board, which passes through the line of centers of the lead receiving holes, permits closer axial placement of the components. If linearly adjacent components are alternatively deflected out of the plane in opposite directions, it is possible for the components to have linear overlap without danger of short circuits and without relative interference between the overlapping component bodies.

In view of the foregoing, it is an object of this invention to provide a mechanism and a method which will enable electrical components or the like to be inserted into a circuit board by means of an automated process with the component body deflected out of a plane passing through the line of centers of the lead receiving holes in the recipient board. This placement enables a manufacturer to place components within the board in linearly overlapping relation without danger of short circuits and therefore place a larger number of components within a given length of a circuit board than has previously been possible.

It is another object to provide means by which it is possible to insert more than one component lead into a single hole as well as enabling leads of one component to alternate with leads of an adjacent component along the same line of centers of lead receiving holes.

In accordance with the above objects, as a feature of this invention there is disclosed a method for automatically deflecting a component body away from a plane passing through the line of centers of the lead receiving holes of the recipient board.

In accordance with another feature, there is provided in combination with the insertion head of an automatic machine for inserting components in a line of holes in a circuit board, an extensible driving arm to deflect the component bodies out of alignment with the line of component receiving holes, permitting more components to be placed in a line of a given length.

The above and other features of the invention including various novel method steps as well as details of construction and combinations of parts will now be more particularly described with reference to the accompanying drawings and pointed out in the claims.

Figure 1:
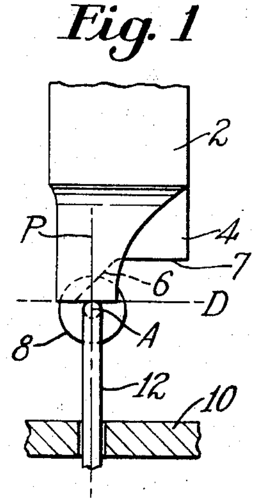
FIGS. 1–3 are side elevations of the component inserting head and extensible anvil disclosing the sequence of the operative method steps of inserting a component.

The apparatus of this invention is an improvement upon the inserting means of the Alderman et al. patent referred to above. In FIGS. 1–4 there will be seen the outside formers 2 which shape the component leads, after they have been cut to proper length, so that they will easily fit into the provided holes in a circuit board. In the Alderman et al. inserting mechanism there is provided between the formers a driving bar which comprises a reciprocating mechanism having a notch formed at its free end to engage the component body urged same directly downwardly toward the board, the leads having been oriented by the formers to pass into the provided holes. In general, the driving bar would not force the component into contact with the board but would leave a small gap for air circulation. However, this method of insertion left the axis of the component body lying in a single plane generally perpendicular to the board which passes through the line of centers of the lead receiving holes.

The applicant has replaced the notched driving bar of the prior art with a novel driving bar 4 having an angular or inclined cam surface 6 on its free end which intersects a second surface 7 which is substantially normal to the direction of movement of the driving bar. Although a specific shape has been shown and described for the driving bar, it is to be understood that a variance in shape (i.e. smooth concave, angled uniplanar) to accommodate components of a different size within the scope of this invention.

In operation, components will be fed to the driving head by means known in the art, the formers 2 will, as in prior art, bend the leads so they are parallel in approximately the same plane and on the same side of the component body 8. The formers will guide the component leads into the pre-bored holes without forcing the component body to contact the board. The driving bar 4 then extends downwardly as viewed in FIGS. 1 to 4, forcing, the cam surface 6 against the component body 8 and moving the axis of this body out of the plane P which passes through the line of centers of the lead receiving holes and shown as a line perpendicular to the circuit board 10, i.e. the body 8 passes to the side of plane P. In general, it is the purpose of this invention to move the component body out of the plane of insertion, i.e. the plane passing through the line of centers of the lead receiving holes and the axis of the body of the component after insertion but before deflection.

Figure 2:
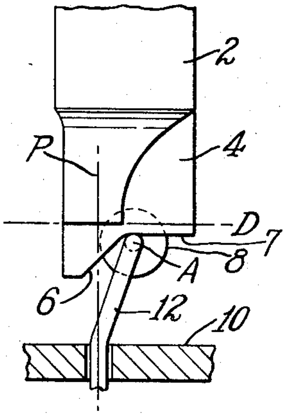
Figure 3:
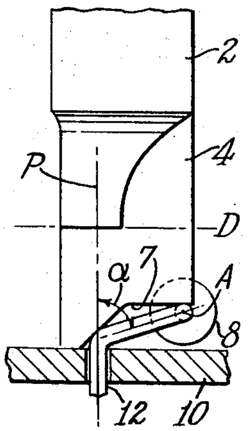

The sequential steps shown in FIGS. 1–3 denote first the component 8 having leads 12 passing through the pre-bored holes in the circuit board 10. It is to be noted that the formers 2 have reached their lowermost position and that the axis A of the component body as well as the entire length of the leads lie in a plane P perpendicular to the board 10 and passing through the center of the lead receiving holes. FIG. 2 depicts the result of part of the downward motion of the driving bar 4, the inclined surface 6 having forced the axis A of the component body 8 out of the plane P. FIG. 3 shows the driving bar 4 at its lowermost position, the component body 8 now at its maximum deflection having been urged downwardly and outwardly by the surface 7 and the leads 12 having been bent to form an acute angle $\alpha$ with the plane P.

Figures 4, 5, 6, 7, 8:
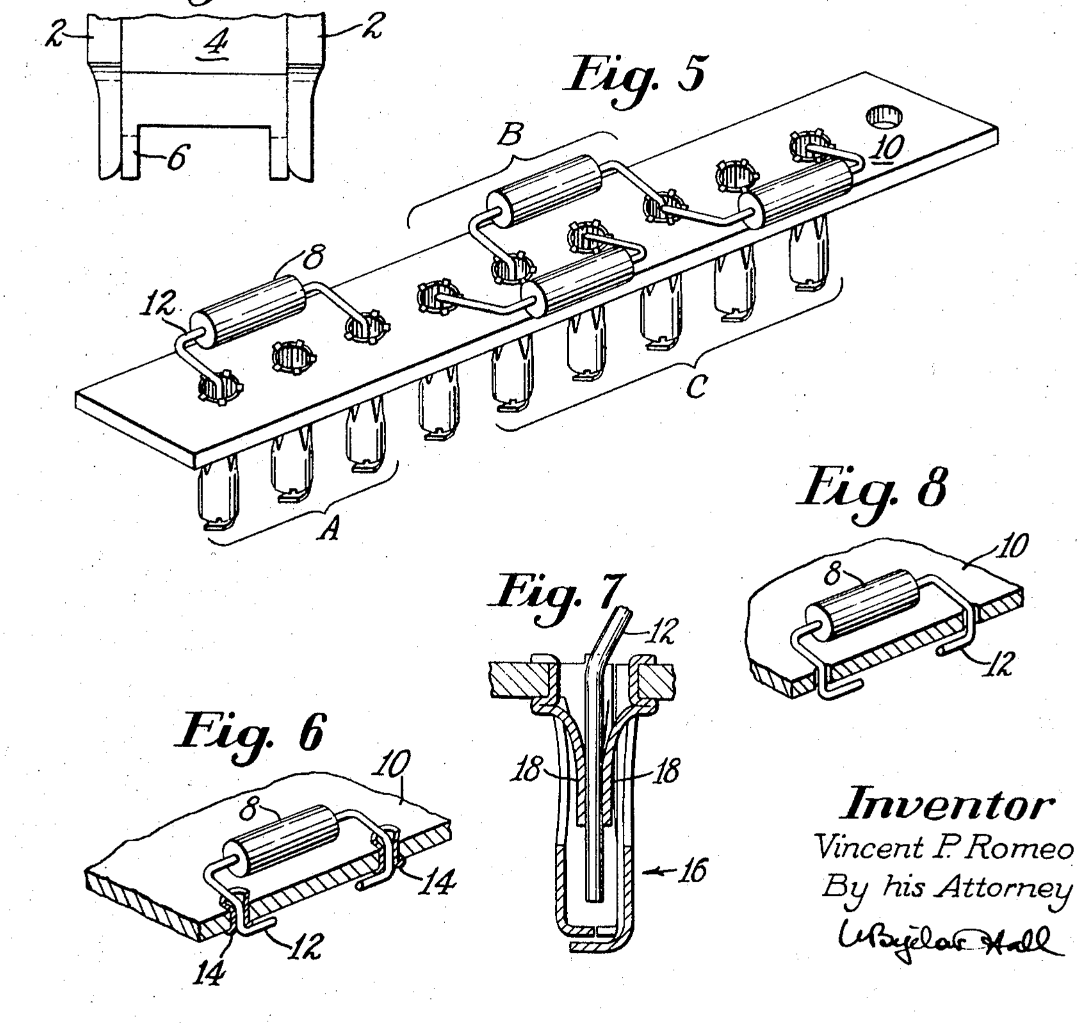
FIG. 4 is a front elevation of the apparatus shown in FIGS. 1–3 without the component.
FIG. 5 is a perspective view of a piece of circuit board showing components in the various positions attainable through the use of the subject mechanism and in accordance with the described method.
FIGS. 6–8 show three of the numerous possible lead receivers usable in conjunction with the invention.

It will be apparent to the reader viewing FIG. 5 that the ability to place components on a circuit board with one or more of the components out of the plane P allows the manufacturer a great deal of versatility in placement of components. The component lying within the bracket A is illustrative of the position of a single component placed in a board in accordance with this invention whereas the arrangements depicted in brackets B and C show configurations involving more than one component easily available to a manufacturer using the inventive device and method.

To enable the manufacturer of circuit boards containing components to attain the configuration shown in brackets B and C of FIG. 5, it will be necessary to have either two component inserting machines with the driver facing in opposite directions or to provide a driver bar within an inserting head which is rotatingly mounted within the machine enabling the entire mechanism to rotate 180°.

Although in FIG. 5 the component receiving board uses a specific fastener for illustrative purposes it is to be noted as shown in FIGS. 6–8 that the lead receiving element is not critical.

FIG. 6 shows a component after it has been inserted and deflected. The hole through which the leads 12 are passed is lined with a funnel shaped eyelet 14 which offers only a slight frictional resistance to the insertion of the leads.

FIG. 7 shows a cross sectional view of the fastener illustrated in FIG. 5. It is to be noted that this fastener is a generally closed bottom barrel 16 having portions of the side of the barrel bend inwardly forming fingers 18 which frictionally contact the lead of the component which is inserted therein.

Referring now to FIG. 8, it is to be noted that whereas the previous illustrative lead receiving elements frictionally contacted the lead the apparatus works equally well when the leads are inserted through a hole in the circuit board which offers no frictional resistance whatsoever.

The above noted versatility makes applicant's invention extremely desirable in that the particular type of component receiving element preferred by the manufacturer does not affect the operation of the mechanism.

It will be understood that the particular machine embodying the invention is shown by way of illustration only and not as a limitation of the invention. The principles and features of this invention may be employed in varied and numerous embodiments without departing from the scope of the invention.

Having thus described my invention, what I claim as new and desire to secure by Letters Patent of the United States is:

1. In a component inserting machine having an inserting head for assembling components on a pre-punched board, the combination of a pair of formers for bending the two leads of a component into a generally uniplanar and parallel position in alignment with holes in the board and for inserting said leads part way into the holes leaving the component body spaced therefrom, and an elongated driving bar movably mounted between the formers for moving beyond the lowermost position of the formers, said bar having means for laterally displacing the component body out of the plane defined by the line of centers of the holes and the axis of the component body after insertion of the leads but before displacement of the body.

2. The machine as in claim 1 in which the means for displacing the component body is an inclined cam surface on the driving bar.

3. The machine as in claim 1 in which the means for displacing the component body is an inclined cam surface on the driving bar and a second surface intersecting the inclined surface and substantially normal to the direction of movement of the driving bar.

References Cited

UNITED STATES PATENTS

| | | | |
|---|---|---|---|
| 2,928,165 | 3/1960 | Carlzen et al. | 29—203 X |
| 2,896,213 | 7/1959 | Alderman et al. | 227—1 |
| 3,126,549 | 3/1964 | Crawford | 227—100 |
| 3,200,481 | 8/1965 | Lenders | 29—203 |

JOHN F. CAMPBELL, *Primary Examiner.*

D. C. REILEY, *Assistant Examiner.*

U.S. Cl. X.R.

29—626; 227—100